United States Patent
Backhausen et al.

(10) Patent No.: US 10,056,145 B2
(45) Date of Patent: Aug. 21, 2018

(54) RESISTIVE MEMORY TRANSITION MONITORING

(71) Applicant: Infineon Technologies AG, Neubiberg (DE)

(72) Inventors: Ulrich Backhausen, Taufkirchen (DE); Giacomo Curatolo, Unterhaching (DE); Jens Rosenbusch, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/447,466

(22) Filed: Mar. 2, 2017

(65) Prior Publication Data
US 2017/0256315 A1    Sep. 7, 2017

(30) Foreign Application Priority Data

Mar. 2, 2016 (DE) .......................... 10 2016 203 446

(51) Int. Cl.
| | |
|---|---|
| G11C 11/00 | (2006.01) |
| G11C 13/00 | (2006.01) |
| G01R 31/12 | (2006.01) |
| G01R 31/14 | (2006.01) |
| G11C 29/02 | (2006.01) |
| G11C 29/50 | (2006.01) |

(52) U.S. Cl.
CPC ...... *G11C 13/0097* (2013.01); *G01R 31/1227* (2013.01); *G01R 31/14* (2013.01); *G11C 13/004* (2013.01); *G11C 13/0061* (2013.01); *G11C 13/0064* (2013.01); *G11C 13/0069* (2013.01); *G11C 29/021* (2013.01); *G11C 29/028* (2013.01); *G11C 13/0026* (2013.01); *G11C 13/0028* (2013.01); *G11C 2013/0045* (2013.01); *G11C 2013/0054* (2013.01); *G11C 2013/0066* (2013.01); *G11C 2013/0083* (2013.01); *G11C 2029/5006* (2013.01); *G11C 2213/79* (2013.01)

(58) Field of Classification Search
CPC .............. G11C 13/0097; G11C 13/061; G11C 13/0069; G11C 13/004
USPC ................................ 365/148, 206
See application file for complete search history.

(56) References Cited

U.S. PATENT DOCUMENTS

| | | | | |
|---|---|---|---|---|
| 6,504,779 | B2 * | 1/2003 | Perner | G11C 7/06 365/129 |
| 9,318,194 | B1 * | 4/2016 | Siau | G11C 13/004 |
| 9,672,917 | B1 * | 6/2017 | Costa | H01L 27/11582 |
| 9,673,798 | B1 * | 6/2017 | Tang | H03K 5/1565 |
| 2009/0279349 | A1 * | 11/2009 | Shih | H01L 27/2436 365/163 |

(Continued)

OTHER PUBLICATIONS

German Patent Office, Office Action issued for DE 102016203446. 4, 5 pgs., dated Jan. 19, 2017.

*Primary Examiner* — Viet Q Nguyen
(74) *Attorney, Agent, or Firm* — Schiff Hardin LLP

(57) ABSTRACT

A circuit for monitoring a resistive memory having an array of cells coupled between respective bitlines and respective wordlines. The circuit includes a current determining circuit configured to determine a cell current and a cell current change rate of at least one of the cells; and a control circuit configured to: determine whether the cell current change rate is outside of a cell current change rate predefined range; and perform a predetermined action if the control circuit determination is positive.

20 Claims, 7 Drawing Sheets

(56) References Cited

U.S. PATENT DOCUMENTS

| | | | |
|---|---|---|---|
| 2011/0305066 A1* | 12/2011 | Nazarian | G11C 13/0011 |
| | | | 365/148 |
| 2012/0026778 A1* | 2/2012 | Maejima | G11C 8/08 |
| | | | 365/148 |
| 2012/0126783 A1* | 5/2012 | Jefremow | G11C 7/02 |
| | | | 324/76.77 |
| 2012/0257438 A1* | 10/2012 | Siau | G11C 11/5685 |
| | | | 365/148 |
| 2013/0148406 A1* | 6/2013 | Shimakawa | G11C 11/1673 |
| | | | 365/148 |
| 2013/0336054 A1 | 12/2013 | Parkinson | |
| 2014/0043886 A1* | 2/2014 | Wu | G11C 11/419 |
| | | | 365/148 |
| 2014/0104931 A1* | 4/2014 | Katoh | G11C 13/0007 |
| | | | 365/148 |
| 2014/0328108 A1* | 11/2014 | Nazarian | G11C 13/0069 |
| | | | 365/148 |
| 2016/0071585 A1* | 3/2016 | Ogiwara | G11C 13/0038 |
| | | | 365/163 |
| 2016/0372200 A1* | 12/2016 | Li | G11C 16/08 |
| 2017/0206956 A1* | 7/2017 | Foltin | G11C 13/004 |

* cited by examiner

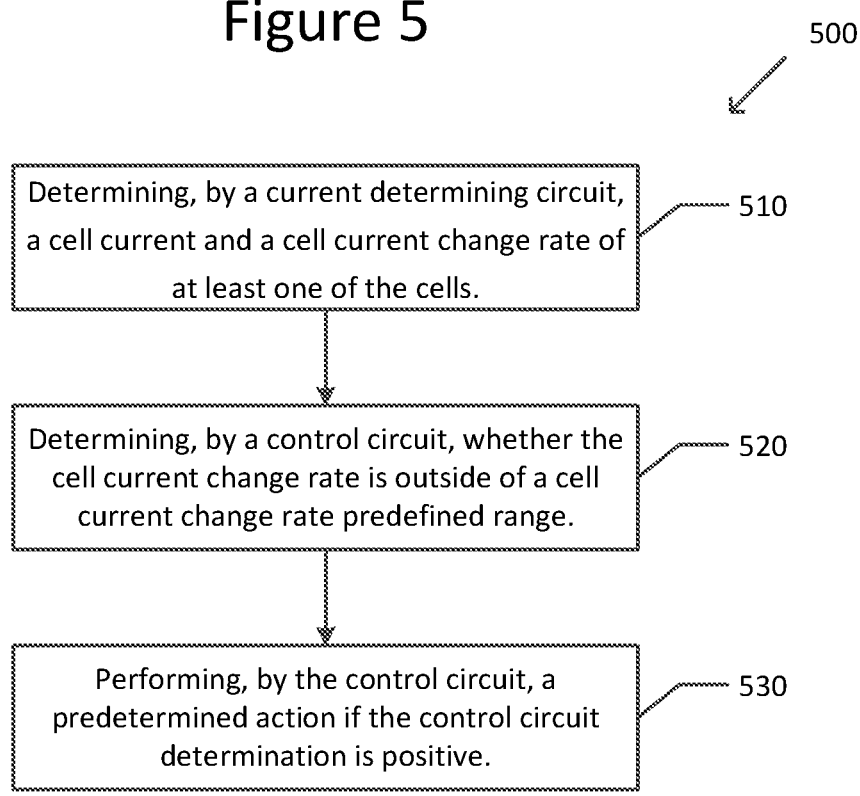

RESISTIVE MEMORY TRANSITION MONITORING

BACKGROUND

Resistive Random Access Memory (RRAM or ReRAM) is a non-volatile memory in which a dielectric that is normally insulating is configured to conduct after application of a sufficiently high voltage. The formation of a conduction path in the dielectric typically requires a relatively high voltage. Once the path is formed, the path may be RESET (i.e., broken to provide high resistance) or SET (re-formed to provide a low resistance) by an appropriately applied voltage. As used herein, an operation where a ReRAM cell in a high resistive state changes to a low resistive state during a time $t_{SET}$ is a SET operation. Conversely, an operation where a ReRAM cell in a low resistive state changes to a high resistive state during a time $t_{RESET}$ is a RESET operation.

The ReRAM SET/RESET process conventionally has been purely time-based, that is, during the process a voltage is applied on a wordline/bitline of a ReRAM cell for a fixed time period, $t_{WRITE}$. However, if the SET time is less than the WRITE time ($t_{SET} < t_{WRITE}$), there is high current consumption and potentially further stress (overset cycling problems). And if the RESET time is less than the WRITE time ($t_{RESET} < t_{WRITE}$), there is high voltage stress on the ReRAM cell after the cell transition.

BRIEF DESCRIPTION OF THE DRAWINGS

FIG. 5 illustrates a flowchart of a method of monitoring resistive memory in accordance with an aspect of the disclosure.

DETAILED DESCRIPTION

The present disclosure is directed to a circuit for monitoring a resistive memory having an array of cells coupled between respective bitlines and respective wordlines. The circuit comprises a current determining circuit and a control circuit. The current determining circuit is configured to determine a cell current and a cell current change rate of at least one of the cells. The control circuit configured to determine whether the cell current change rate is outside of a cell current change rate predefined range, for example, too high or too low. If this determination is positive, the control circuit can perform a predetermined action.

The predetermined action may be dynamic or static. A dynamic action may be stopping the cell state transition sequence, or adjusting the wordline voltage and/or bitline voltage during the cell transition sequence. A static action may be, after cell currents at predetermined times and a cell current change rate are stored, the stored values are used to adjust the wordline voltage and/or bitline voltage between cell state transition sequences.

Figure 1:
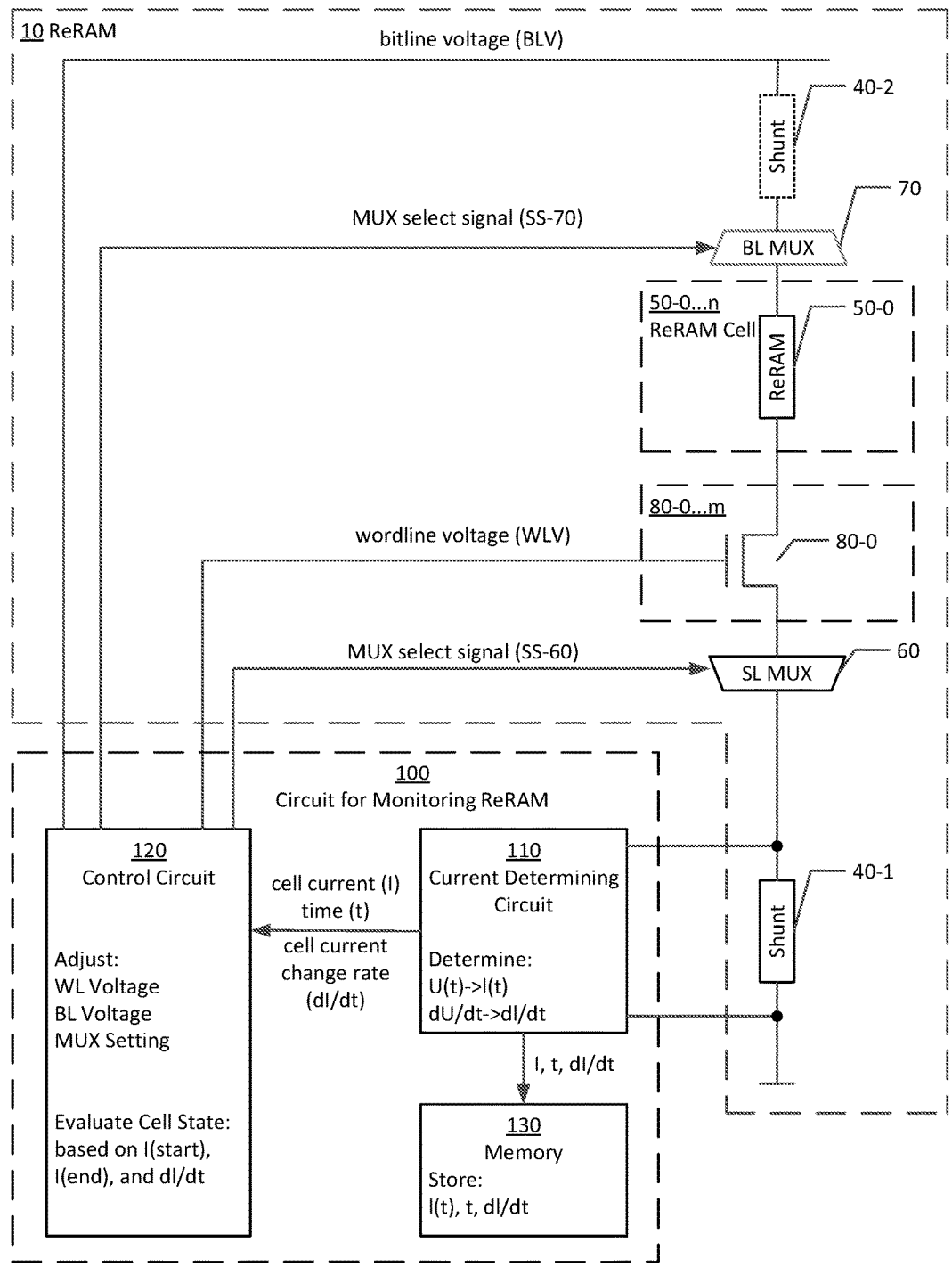
FIG. 1 illustrates a circuit for monitoring resistive memory in accordance with an aspect of the disclosure.

FIG. 1 illustrates a circuit 100 for monitoring resistive memory in accordance with an aspect of the disclosure, and also illustrates a conventional resistive memory 10 to place the circuit 100 in context.

The circuit 100 comprises a current determining circuit 110, a control circuit 120, and a memory 130.

The conventional resistive memory 10 has an array of cells 50-0 . . . n coupled between respective bitlines BL and respective wordlines WL. In the figure only one cell 50-0 is shown, but in reality there is an array of cells 50-0 . . . n. The array of cells 50-0 . . . n operates in conjunction with two multiplexers 60, 70, select transistors 80-0 . . . m, and shunt 40-1 (and/or shunt 40-2). This resistive memory 10 with two multiplexers is applicable for any resistive memory operating under a bipolar SET/RESET scheme. The general operation of the resistive memory 10 is known, and for the sake of brevity, will not be provided here.

The control circuit 120 is configured to provide a bitline voltage BLV to the bitline multiplexer 70. The control circuit 120 is also configured to control the bitline multiplexer 70 by providing a multiplexer select signal SS-70 such that the bitline voltage BLV is provided to a selected cell 50-0.

Furthermore, the control circuit 120 is configured to control a select transistor 80 by providing a wordline voltage WLV. The wordline voltage WLV selection is performed by a multiplexer (not shown) located within the control circuit 120. The control circuit 120 is further configured to control a sourceline multiplexer 60 by providing a multiplexer select signal SS-60 such that the selected cell 50-0 may be coupled to ground via the shunt 40-1. The shunt 40-1 is adjustable for different current measurement ranges. Optionally, additionally or alternatively, a second shunt 40-2 may be coupled on the other side of the cell 50-0 between the bitline multiplexer 70 and the control circuit 120, depending on the particular circuit design and the physics of the cell 50-0.

The current determining circuit 110 is configured to determine a cell current I at certain times t and a cell current change rate dI/dt (i.e., a derivation of the cell current I) of at least one of the cells 50-0. This determination may be made during a cell resistance transition sequence of the at least one cell 50-0. The cell resistance transition sequence may be a set operation, a reset operation, and/or a forming operation of the at least one cell 50-0. This determination by the current determining circuit 110 is not limited to being performed during a cell resistance transition sequence, but may be made at any time. For example, the determination may be performed during a normal read operation in which the determined values are then be used to determine a cell current transition speed.

The memory 130 is configured to store the determined cell current I at predetermined times I(t), and to store the determined cell current change rate dI/dt.

The control circuit 120 is configured to determine whether the cell current change rate dI/dt is outside of a cell current change rate predefined range. If this determination is positive, perform a predetermined action.

The predetermined action may be any of a number of actions. The predetermined action may be a static adjustment of the bitline voltage BLV and/or the wordline voltage WLV of the at least one cell 50-0, performed between cell resistance transition sequences. Alternatively, the predetermined action may be a dynamic adjustment of the bitline voltage BLV and/or the wordline voltage WLV of the at least one cell 50-0, performed during a cell resistance transition sequence of the at least one cell 50-0. Alternatively, the predetermined action may be stopping a cell resistance transition sequence of the at least one cell 50-0, or replacing the at least one cell 50-0 with a redundant cell. Alternatively, the predetermined action may be a modification of cell resistance transition sequences timing.

The cell current change rate predefined range may be based on a compliance setting of the cell current I or of the cell current change rate dI/dt.

The current determining circuit 110 may be configured to determine a cell current I and a cell current change rate dI/dt of a plurality of the cells 50, rather than of a single cell. In such a case, the control circuit 120 is configured to determine whether the cell current change rate dI/dt of any of the plurality of cells 50 is outside of the cell current change rate predefined range, and perform the predetermined action if the control circuit determination is positive for any of the cells 50. Each of the plurality of cells 50 may have an individual cell current change rate predefined range, or alternatively, a same cell current change rate predefined range that applies to each of the cells.

The current determining circuit 110 may be configured to determine the cell current I and the cell current change rate dI/dt of the plurality of cells 50 sequentially. Alternatively, the current determining circuit 110 may be configured to determine the cell current I and the cell current change rate dI/dt of a plurality of cells 50 simultaneously; in such a case, the control circuit 120 may be configured to determine whether a median of the cell current change rate dI/dt of the plurality of cells 50 is outside of a median cell current change rate predefined range, and perform a predetermined action if the control circuit determination is positive.

The control circuit 120 may also be configured to ramp the wordline voltage WLV and/or the bitline voltage BLV of the at least one cell 50-0 until a predetermined cell current change rate dI/dt is reached.

The shunt 40-1 does not need to be coupled directly in bitline/sourceline tract, but may instead be in in a different current tract referenced by a current mirror. Rather than a shunt 40-1, an alternative is a sense amplifier and reference current to measure the cell current I.

There are several implementation options for the shunt 40. The shunt 40 may be placed on one or both sides of the cell 50-0 (40-1 and 40-2). Depending on the size and mode (SET/RESET), a shunt 40 may be bypassed on one side of the cell 50-0 to use only the shunt 40 on the other side. Also, the sizes of the shunts 40-1, 40-2 may be adjusted.

If the shunts 40-1, 40-2 are placed on both sides (sourceline, bitline) of the cell 50-1, a differential current measurement I(sourceline)−I(bitline) can be performed to examine potential leakage currents, for example, on the selected bitline BL during a RESET process. In case of a parallel write, it is possible to couple all cells 50-0 . . . n to the same shunt 40 to obtain an average current.

Figure 2:
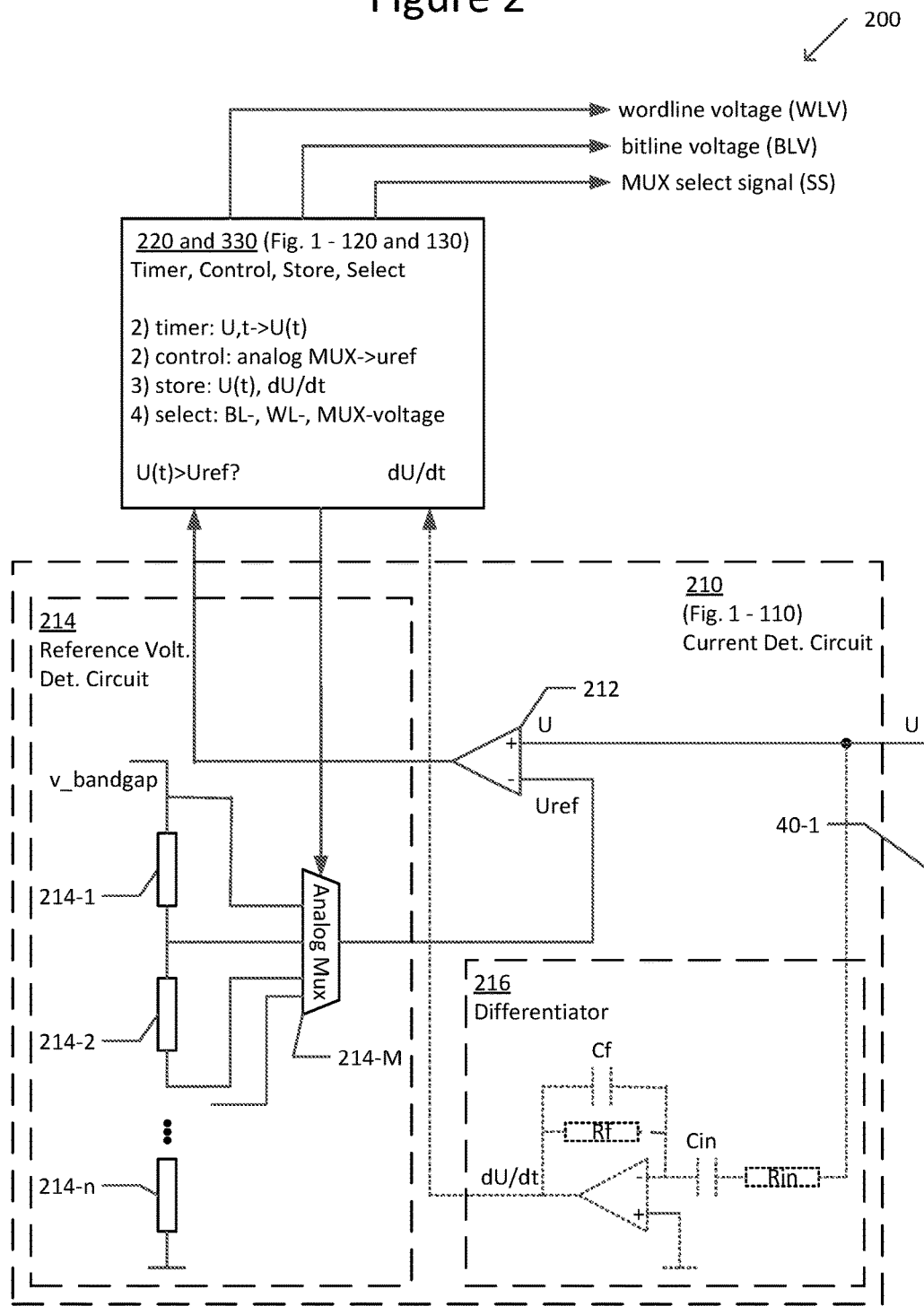
FIG. 2 illustrates a circuit for monitoring resistive memory in accordance with another aspect of the disclosure.

FIG. 2 illustrates a circuit 200 for monitoring resistive memory in accordance with another aspect of the disclosure.

The circuit 200 is similar to the circuit 100 of FIG. 1, except that the control circuit 220 and memory 230 are illustrated in a single box for the sake of simplicity, and includes details of an exemplary embodiment of a current determining circuit 210.

The current determining circuit 210 comprises a reference voltage generation circuit 214, a comparator 212, and optionally, a differentiator 216.

The reference voltage generation circuit 214 comprises resistors 214-1 . . . n coupled in series and an analog multiplexer 214-M. A bandgap voltage v_bandgap is supplied to the series of resistors 214-1 . . . n, and nodes between the resistors 214-1 . . . n are coupled to one of the inputs of the analog multiplexer 214-M. The analog multiplexer 214-M selects, based on an input signal from the control circuit 220, one of the nodes and outputs the corresponding voltage as the reference voltage Uref to one of the inputs of the comparator 212.

The comparator 212 is configured to compare the shunt voltage U at periodic times with the reference voltage Uref. The reference voltage Uref may be swept by a state machine from start level $Uref_{min}$ to $Uref_{max}$, for example. The sweep is stopped when the shunt voltage U crosses the reference voltage sweep (> for SET, < RESET). A timer (not shown) determines the time of this cross.

The memory 230 is configured to store the shut voltage U at periodic times U(t). The shunt voltage change rate dU/dt may be determined by the control circuit 220 by performing a digital differentiation based on stored U(t) values. As is known, a difference between two shunt voltages U divided by the difference between the corresponding times, which is the derivative of the shunt voltage, results in the shunt voltage change rate dU/dt. Alternatively, the differentiator 216 may measure the shunt voltage change rate dU/dt directly. (Differentiators are known, and for the sake of brevity, details are not provided here.) The control circuit 220 may then be configured to determine the cell current I and the cell current change rate dI/dt based on the shunt voltage U and the shunt voltage change rate dU/dt.

The shunt voltage U(t) and shunt voltage change rate dU/dt are compared with targets/expected values. Based on comparison, the wordline voltage WLV and/or the bitline voltage BLV may be switched on or off, or adjusted to be higher or lower. As many sweeps as possible are performed to obtain several U(t) in small time steps to limit noise influence.

Alternatively, at the beginning of the cell transition sequence, the initial shunt voltage U(t0) may be sampled and held. Based on the initial shunt voltage U(t0), additional shunt voltage levels based on the initial shunt voltage value U(t0), such as multiples of the initial shunt voltage value U(t0), may be used as the reference voltages Uref instead of the analog multiplexer selected values, as discussed above. The shunt voltage U(t) is then compared with the additional reference voltage levels Uref to determine the shunt voltage U. A timer (not shown) runs to record the timings of the comparisons, so that an analog shunt voltage change rate dU/dt may be determined.

Alternatively, the bitline voltage BLV and/or wordline voltage WLV may be ramped during cell switching. The cell current I and cell current change rate dI/dt may be determined based on the shunt voltage U and shunt voltage change rate dU/dt. The ramping is stopped when the cell current I and/or the cell current change rate dI/dt (or shunt voltage U and shunt voltage change rate dU/dt) is above or below a predefined value.

Figure 3:
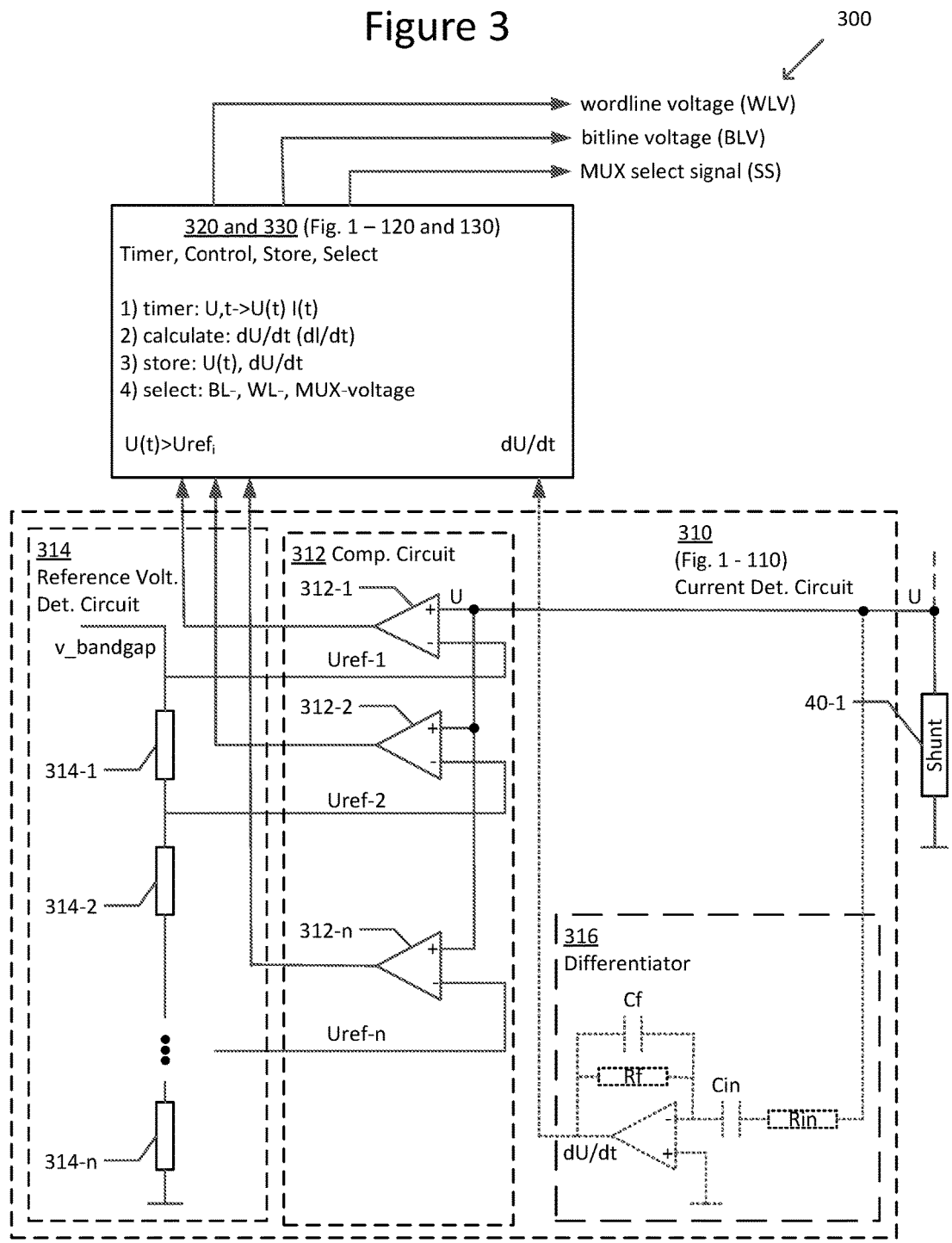
FIG. 3 illustrates a circuit for monitoring resistive memory in accordance with another aspect of the disclosure.

FIG. 3 illustrates a circuit 300 for monitoring resistive memory in accordance with another aspect of the disclosure.

The circuit 300 is similar to the circuit 100 of FIG. 1 except that the circuit 300 includes the control circuit 320 and memory 330 illustrated for the sake of simplicity in a single box, and includes a different exemplary embodiment of a current determining circuit 310.

The current determining circuit 210 of FIG. 2, which is a time-based Analog-to-Digital Conversion (ADC), is replaced by current determining circuit 310, which is a "flash" ADC performing parallel comparisons. The current determining circuit 310 of FIG. 3 is less time consuming than that of FIG. 2.

The current determining circuit 310 comprises a comparing circuit 312 and a reference voltage generating circuit 314.

The reference voltage generating circuit 314 is similar to the reference voltage generation circuit of FIG. 2 in that it comprises resistors 314-1 . . . n coupled in series. However, rather than an analog multiplexer and a single comparator 212, the reference voltages Uref-1 . . . n are supplied from node between the resistor 314-1 . . . n directly to a plurality of respective comparators 312-1 . . . n of the comparing circuit 312. The plurality of comparators 312-1 . . . 312-n are configured to compare the shunt voltage U with the respective reference voltages Uref-1 . . . n to determine the shunt voltage U.

Similar to the circuit 200 of FIG. 2, the memory 330 is configured to store the shut voltage U at the periodic times U(t), and the control circuit 310 is configured to determine the shunt voltage change rate dU/dt. Also similar, there is an optional differentiator 316 configured to determine the shunt voltage change rate dU/dt directly.

With a flash ADC, only a few comparisons are necessary, so there is no need to convert to a high resolution. Only a few stages, perhaps less than eight, is sufficient. Also, area is not critical because only one to four flash ADCs may be necessary. Most applications can SET/RESET only one or two bits in parallel due to high current consumption. The reference voltage Uref could be generated by U(0)×10, which is an initial shunt voltage U multiplied by 10, for example. And the same amplifier could be used to input the flash ADCs, thereby reducing the effect of the offset.

FIGS. 4A-4E illustrate charts and corresponding graphs (400A-400E, respectively) of a register-based SET process in accordance with an aspect of the disclosure.

By way of overview, the cell current I and cell current change rate dI/dt are determined in order to optimize a next step of the SET/RESET process. Each cell 50-0 . . . n is compared with a series of reference currents, and the results are stored in registers as bits (per cell, per reference current). From Step 1 to Step 4 of the SET/RESET process, shown in FIGS. 4B to 4E, respectively, the changes in the register bits are evaluated in order to determine how a bitline voltage BLV and/or wordline voltage WLV (hereinafter for FIGS. 4A-4E referred to as a "switch voltage") for a subsequent step should be adjusted.

Figure 4A:
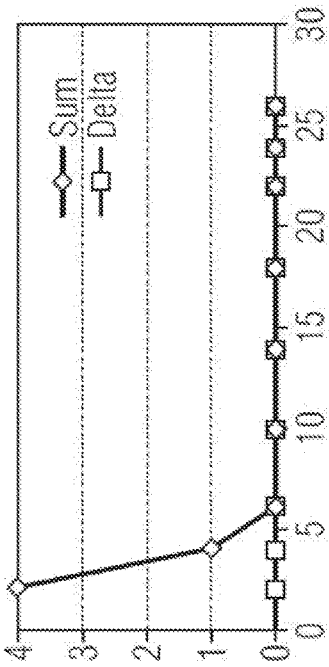
FIGS. 4A-4E illustrate charts and corresponding graphs of a register-based SET process in accordance with an aspect of the disclosure.

FIG. 4A shows the state of a register at the beginning of a cell switching, that is, in the RESET state. Line "0" represents a state of a cell 50-0, line "1" represents a state of cell 50-1, line "n−1" represents a state of a cell 50-n−1, and line "n" represents a state of a cell 50-n. The bits in lines "0" to "n" in columns "2" to "26" refers to a measured cell current I of the respective cell 50-0 . . . n. A bit is set if the cell current I indicated is reached by the respective cell 50-0 . . . n. For example, cell 50-0 has reached a current value I of 2 μA, whereas cell 50-1 has reached a current value I of 4 μA.

Figure 4B:
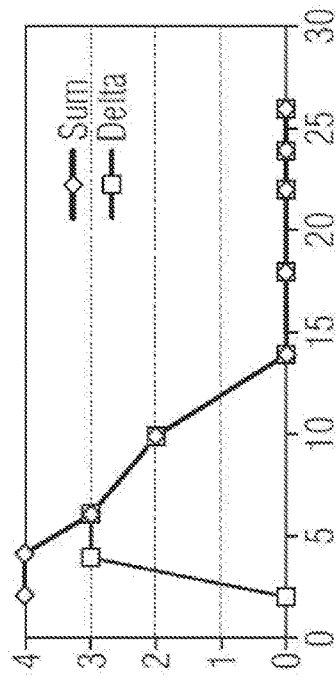

The bits set in the columns 2 to 26 μA are summed up in the line "sum". The bits set for each of the cells 50-0 . . . n are summed up in a column "sum". The field in the crossing of the line "sum" and the column "sum" indicates the average of the bits set per cell 50-0 . . . n, which is calculated in the example of FIG. 4A by 5/4=1.25 as 4+1=5 bits are set and the number of cells is 4. In the example of FIG. 4B the average of the bits set per cell 50-0 . . . n is calculated by 13/4=3.25, as 4+4+3+2=13 bits are set and the number of cells is 4.

In the line "delta", the difference of the adjacent value in the line "sum" compared with an earlier state (shown in the previous figure of FIGS. 4A-4E) is indicated. Furthermore, in the column "delta" the difference of the adjacent value in the column "sum" compared with an earlier state (shown in the previous figure of FIGS. 4A to 4E) is indicated. However, as FIG. 4A shows the initial state, the values in the line "delta" and in the column "delta" are 0.

FIG. 4B shows the state of the register at Step 1 of the switching. In Step 1 the cell current change rates dI/dt, as indicated in column "delta", of cells 50-0 and 50-1 are considered to be normal, as indicated by "OK". The cell current change rate dI/dt (as indicated in column "delta") of cell 50-1 is considered to be too fast, and the current change rate dI/dt (as indicated in column "delta") of the cell 50-n is considered to be too slow. Thus, in Step 1, the bits in total move quite fast (see box Delta, Delta). Therefore, the switch voltage (WLV and/or BLV) for a subsequent step should be reduced.

Figure 4C:
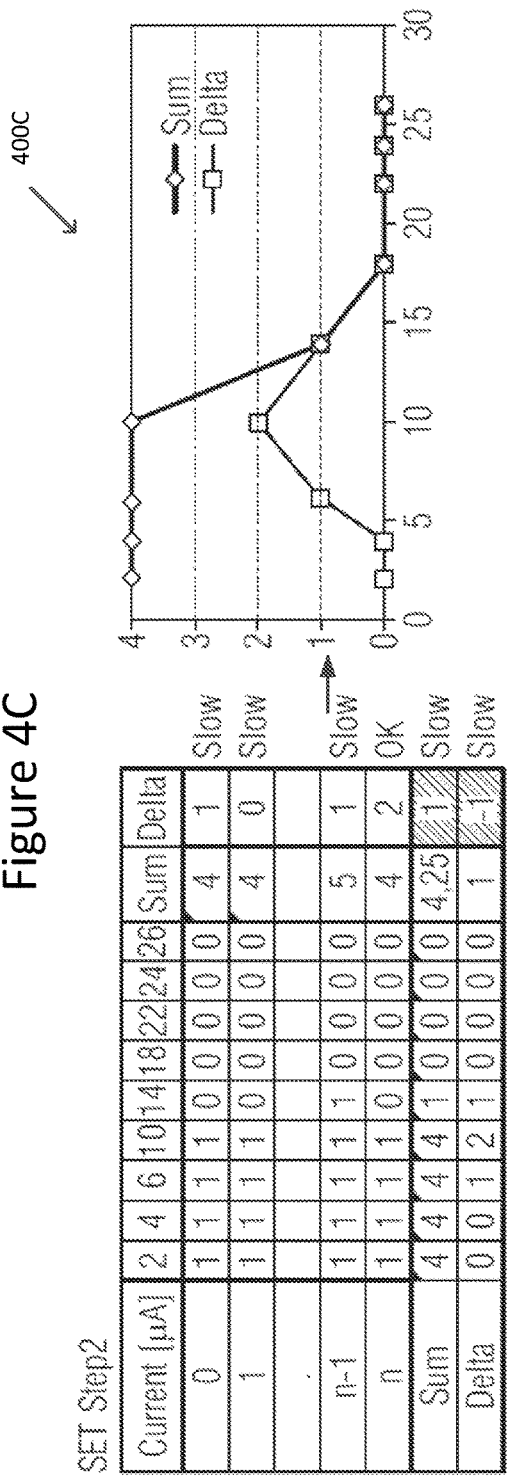

FIG. 4C shows the state of the register at Step 2 of the switching. In Step 2 the cell current change rates dI/dt of cells 50-0, 50-1, and 50-n−1 are considered to be too slow, and the current change rate dI/dt of cell 50-n is considered to be normal. Thus, in Step 2, the bits in total move too slowly (see box Delta, Delta). Therefore, the switch voltage (WLV and/or BLV) for a subsequent step may be increased.

Figure 4D:
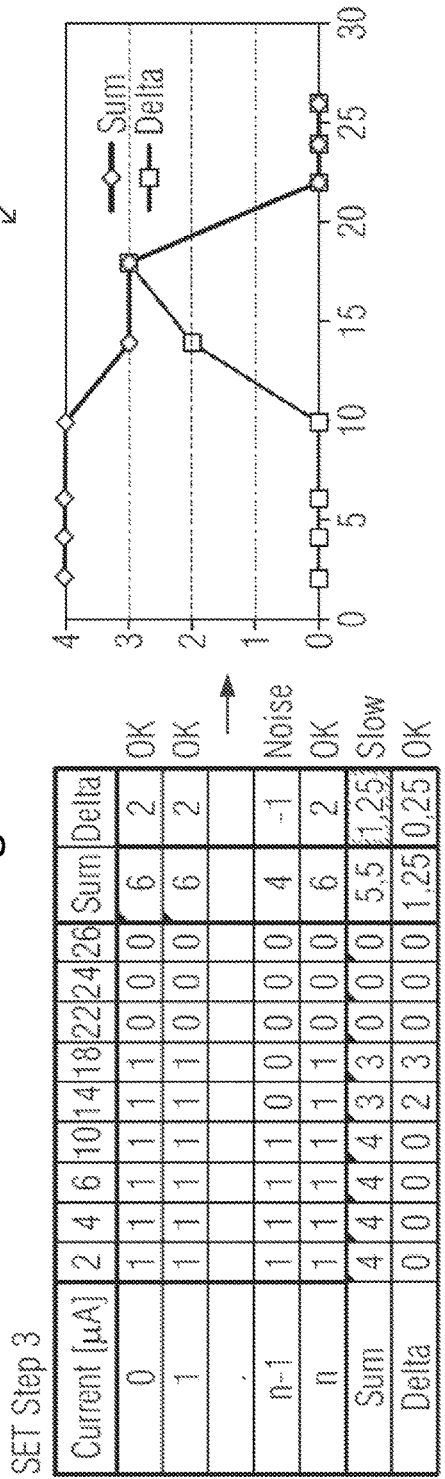

FIG. 4D shows the state of the register at Step 3 of the switching. In Step 3 the current change rates dI/dt of cells 50-0, 50-1, and 50-n are considered to be normal, whereas the current change rate dI/dt of cell 50-n−1 changes sign, which is an indication of noise. Thus, in Step 3, the bits in total move slow (see box Delta, Delta). Therefore, the switch voltage (WLV and/or BLV) for a subsequent step may be increased.

Figure 4E:
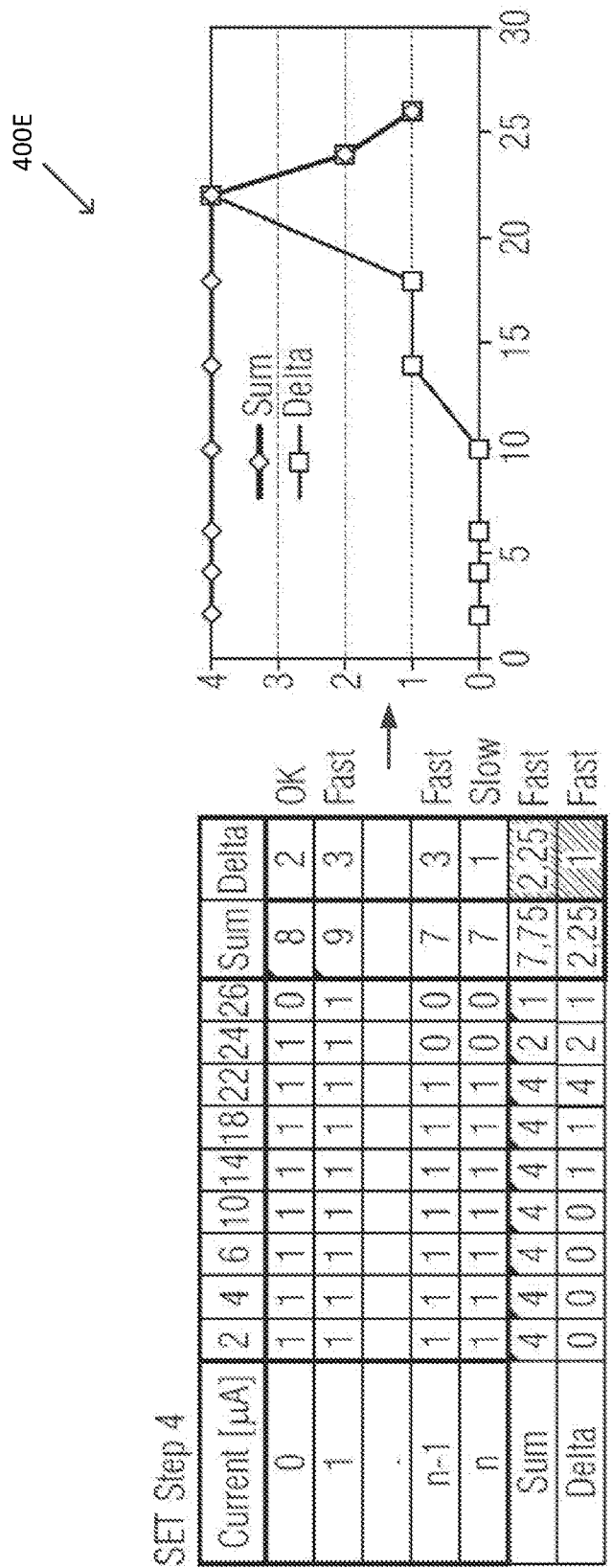

FIG. 4E shows the state of the register at Step 4 of the switching. In Step 4 the current change rates dI/dt of cell 50-0 is considered to be normal, the current change rates dI/dt of cells 50-1 and 50-n−1 are considered to be too high, and the current change rate dI/dt of the cell 50-n is considered to be slow. Thus, in Step 4, the bits in total move fast (see box Delta, Delta). Assuming that a current value I of 22 μA is sufficient, the SET process may be ended.

There are two possible uses for the register based optimization. First, each cell 50-0 . . . n may be considered individually, wherein the switch voltage for each of the cells 50-0 . . . n is individually optimized based on the cell current change rate dI/dt of the respective cell 50-0 . . . n. This leads to a minimized single cell stress and minimized time to change the cell state. This register based optimization is limited by noise of cell current measurements I and can be used to characterize or analyze different defects of an individual cell 50.

Another possible use is a combined cell current change rate dI/dt for a larger number of cells 50 may be considered, wherein the combined current change rate, for example, may be an average or a median of the current change rates dI/dt of the large number of cells 50. A common switch voltage may be optimized based on the combined current change rate. This leads to a memory array with reduced cell stress, and to an optimized common time to change the cell states. Noise of a single cell current measurement I may be leveled out and can be used to characterize or analyze big data for a complete memory array.

FIG. 5 illustrates a flowchart 500 of a method of monitoring a resistive memory 50 in accordance with an aspect of the disclosure.

The resistive memory has an array of cells 50-0 . . . n coupled between respective bitlines BL and respective wordlines WL.

In Step 510, the current determining circuit 110/210/310 determines a cell current I and a cell current change rate dI/dt of at least one of the cells 50.

In Step 520, the control circuit 120/220/320 determines whether the cell current change rate dI/dt is outside of a cell current change rate predefined range.

In Step 530, the control circuit 120/220/320 performs a predetermined action if the control circuit determination is positive.

The resistive memory cell transition monitoring of the present disclosure is advantageous in numerous respects. The resistive memory cell write/forming sequences are faster. After a memory cell resistance transition sequence, the memory cell is more reliable. The monitoring also results in area reduction, and the algorithms are easier as compared with other non-volatile memories. Furthermore, a more reliable operation increases the robustness of the resistive memory and the failure rate is reduced.

Further, overshoot of currents and/or voltages may be reduced. The memory cell and periphery circuit stress is reduced. There is better monitoring of cells during transition of a cell state. Switching voltages are adapted due to memory cell behavior and/or fast cut-off in case of unexpected/undesired switching behavior. There is monitoring and/or characterization of cells for analysis of cell endurance/retention versus switching behavior (characterization). This disclosure is applicable for field use as well as for cell characterizations/tests. Cells that repeatedly change too fast or too slow may be replaced by redundant cells in a backend test. Unnecessary power consumption is reduced, which is especially critical for chip card contactless applications. And throughput is increased due to shorter write pulses per bit.

Although the disclosure is described in terms of resistive memory generally, the disclosure is not limited in this respect. The disclosure is applicable for all types of resistive memories such as Resistive Random Access Memories (ReRAM) comprising inorganic and organic material systems displaying thermal or ionic resistive switching effects, which can be grouped into the following categories:

phase-change chalcogenides, such as $Ge_2Sb_2Te_5$ and AgInSbTe;
binary transition metal oxides, such as NiO and $TiO_2$;
perovskites, such as $Sr(Zr)TiO_3$ and PCMO;
solid-state electrolytes, such as GeS, GeSe, SiOx and $Cu_2S$;
organic charge-transfer complexes, such as CuTCNQ; and
organic donor-acceptor systems, such as Al AlDCN.

While the foregoing has been described in conjunction with exemplary embodiment, it is understood that the term "exemplary" is merely meant as an example, rather than the best or optimal. Accordingly, the disclosure is intended to cover alternatives, modifications and equivalents, which may be included within the scope of the disclosure.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

Although specific embodiments have been illustrated and described herein, it should be appreciated by those of ordinary skill in the art that a variety of alternate and/or equivalent implementations may be substituted for the specific embodiments shown and described without departing from the scope of the present disclosure. This disclosure is intended to cover any adaptations or variations of the specific embodiments discussed herein.

What is claimed is:

1. A circuit for monitoring a resistive memory having an array of cells coupled between respective bitlines and respective wordlines, the circuit comprising:
    a current determining circuit configured to determine a cell current and a cell current change rate of at least one of the cells;
    a control circuit configured to:
        determine whether the cell current change rate is outside of a cell current change rate predefined range; and
        perform a predetermined action if the control circuit determination is positive; and
    a memory configured to store the determined cell current at predetermined times, and to store the determined cell current change rate.

2. The circuit for monitoring a resistive memory having an array of cells coupled between respective bitlines and respective wordlines, the circuit comprising:
    a current determining circuit configured to determine a cell current and a cell current change rate of at least one of the cells; and
    a control circuit configured to:
        determine whether the cell current change rate is outside of a cell current change rate predefined range; and
        perform a predetermined action if the control circuit determination is positive, wherein the predetermined action is a static adjustment of a bitline voltage and/or a wordline voltage of the at least one cell, performed between cell resistance transition sequences.

3. A circuit of claim 1, wherein the predetermined action is a dynamic adjustment of a bitline voltage and/or a wordline voltage of the at least one cell, performed during a cell resistance transition sequence of the at least one cell.

4. The circuit of claim 1, wherein:
    the current determining circuit is configured to determine a cell current and a cell current change rate of a plurality of the cells, and
    the control circuit is configured to:
        determine whether the cell current change rate of any of the plurality of cells is outside of the cell current change rate predefined range; and
        perform the predetermined action if the control circuit determination is positive for any of the cells.

5. The circuit of claim 4, wherein each of the plurality of cells has an individual cell current change rate predefined range.

6. The circuit of claim 4, wherein the current determining circuit is configured to determine the cell current and the cell current change rate of the plurality of cells sequentially.

7. The circuit of claim 1, wherein:
    the current determining circuit is configured to determine the cell current and the cell current change rate of a plurality of cells simultaneously; and
    the control circuit is configured to:
        determine whether a median of the cell current change rate of the plurality of cells is outside of a median cell current change rate predefined range; and
        perform a predetermined action if the control circuit determination is positive.

8. The circuit of claim 1, wherein the predetermined action is stopping a cell resistance transition sequence of the at least one cell.

9. The circuit of claim 1, wherein the cell current change rate predefined range is based on a compliance setting of the cell current or of the cell current change rate.

10. The circuit of claim 1, wherein the control circuit is configured to:
ramp a wordline voltage and/or a bitline voltage of the at least one cell until a predetermined cell current change rate is reached.

11. The circuit of claim 1, wherein the predetermined action is replacing the at least one cell with a redundant cell.

12. The circuit of claim 1, wherein the current determining circuit is configured to determine the cell current and the cell current change rate during a cell resistance transition sequence of the at least one cell.

13. The circuit of claim 12, wherein the cell resistance transition sequence is a set operation, a reset operation, and/or a forming operation of the at least one cell.

14. The circuit of claim 1,
further comprising a shunt coupled between the at least one cell and ground,
wherein the current determining circuit comprises:
a reference voltage generation circuit configured to generate a sweep of reference voltages at periodic times; and
a comparator configured to compare a shunt voltage with the sweep of reference voltages at the periodic times until the shunt voltage crosses the sweep of reference voltages to determine the shunt voltage.

15. The circuit of claim 14,
wherein the current determining circuit further comprises a differentiator configured to determine the shunt voltage change rate, and
wherein the control circuit is configured to determine the cell current and the cell current change rate based on the shunt voltage and the shunt voltage change rate.

16. The circuit of claim 14, wherein:
the memory is configured to store the shunt voltages and the corresponding periodic times, and
the control circuit is configured to determine the cell current change rate based on the stored shunt voltages and the corresponding periodic times.

17. The circuit of claim 14, wherein the sweep of reference voltages is dynamically determined based on an initial shunt voltage.

18. The circuit of claim 1,
further comprising a shunt coupled between the at least one cell and ground,
wherein the current determining circuit comprises:
a plurality of comparators configured to compare a shunt voltage with respective reference voltages to determine the shunt voltage, and
a differentiator configured to determine the shunt voltage change rate, and
wherein the control circuit is configured to determine the cell current and the cell current change rate based on the shunt voltage and the shunt voltage change rate.

19. A method for monitoring a resistive memory having an array of cells coupled between respective bitlines and respective wordlines, the method comprising:
determining, by a current determining circuit, a cell current and a cell current change rate of a plurality of cells simultaneously;
determining, by a control circuit, whether a median of the cell current change rate of the plurality of cells is outside of a median cell current change rate predefined range; and
performing, by the control circuit, a predetermined action if the control circuit determination is positive.

20. The method of claim 19, further comprising:
determining, by the control circuit, whether the cell current change rate of any of the plurality of cells is outside of the cell current change rate predefined range; and if so,
performing the predetermined action.

\* \* \* \* \*